United States Patent
Mohr et al.

(10) Patent No.: US 10,714,156 B2
(45) Date of Patent: Jul. 14, 2020

(54) APPARATUSES AND METHOD FOR TRIMMING INPUT BUFFERS BASED ON IDENTIFIED MISMATCHES

(71) Applicant: MICRON TECHNOLOGY, INC., Boise, ID (US)

(72) Inventors: Christian N. Mohr, Allen, TX (US); Jennifer E. Taylor, Boise, ID (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/121,325

(22) Filed: Sep. 4, 2018

(65) Prior Publication Data

US 2020/0075067 A1 Mar. 5, 2020

(51) Int. Cl.
*G11C 7/00* (2006.01)
*G11C 7/10* (2006.01)
*H03F 3/45* (2006.01)

(52) U.S. Cl.
CPC .......... *G11C 7/1084* (2013.01); *G11C 7/1096* (2013.01); *H03F 3/45475* (2013.01)

(58) Field of Classification Search
CPC .. G11C 7/1084; G11C 7/1096; H03F 3/45475
USPC ................. 365/189.05, 189.07, 189.11
See application file for complete search history.

(56) References Cited

U.S. PATENT DOCUMENTS

| | | | |
|---|---|---|---|
| 10,325,659 B1* | 6/2019 | Tang | G11C 16/10 |
| 2004/0145388 A1* | 7/2004 | Gallo | H03K 17/164 |
| | | | 326/57 |
| 2017/0169975 A1* | 6/2017 | Iwamoto | H03K 19/21 |
| 2019/0036516 A1* | 1/2019 | Jeong | G01R 35/005 |

* cited by examiner

*Primary Examiner* — Connie C Yoha
(74) *Attorney, Agent, or Firm* — Dorsey & Whitney LLP

(57) ABSTRACT

Apparatuses and methods for trimming input buffers based on identified mismatches. An example apparatus includes an input buffer having a first input stage circuit configured to receive a first signal, a second input stage circuit configured to receive a second signal, and an output stage coupled to the first and second input stage circuits and configured to provide an output signal. The first input stage circuit includes serially-coupled transistor pairs that are each coupled between the output stage and a bias voltage. Each of the plurality of serially-coupled transistors pairs are selectively enabled in response to a respective enable signal. The apparatus further including a trim circuit coupled to the first input stage circuit and comprising a plurality of programmable components. The trim circuit is configured to be programmed to provide the respective enable signals based on a detected transition voltage offset relative to a target transition voltage.

20 Claims, 6 Drawing Sheets

US 10,714,156 B2

APPARATUSES AND METHOD FOR TRIMMING INPUT BUFFERS BASED ON IDENTIFIED MISMATCHES

BACKGROUND

High data reliability, high speed of memory access, and reduced chip size are features that are demanded from semiconductor memory. In recent years, there has been an effort to further increase the speed of memories while simultaneously reducing power consumption. In some applications, memory may be placed a power-down or standby state to reduce power consumption for a period of time. Memory operations may be suspended while the memory is in the power-down or standby state. In some examples, to reduce a transition to normal operation, the memory suspend some portions of the memory in high voltage states. One side effect of suspending some circuitry at a higher voltage state may include unintended leakage current through portions of the circuitry. The leakage current may cause the memory to consume additional power.

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Input buffers are commonly used in integrated circuit devices to condition received data or strobe signals so as to provide output signals having well-defined logic levels, either for internal use or for transmission to external devices. Such buffers generally include some form of differential amplifier responsive to two input voltage signals, such as complementary strobe signals, or a data signal and a reference voltage. In an ideal situation, a differential amplifier will operate to transition its output voltage signal when the two input voltage signals cross, e.g., when they are equal. However, variabilities inherent in typical integrated circuit fabrication, or imbalances in signal termination impedance, may result in a voltage offset, such that the buffer may transition its output voltage signal at a point other than when the two input voltage signals are equal. Such behavior can be a significant error source surrounding setup and hold time requirements for the buffer.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
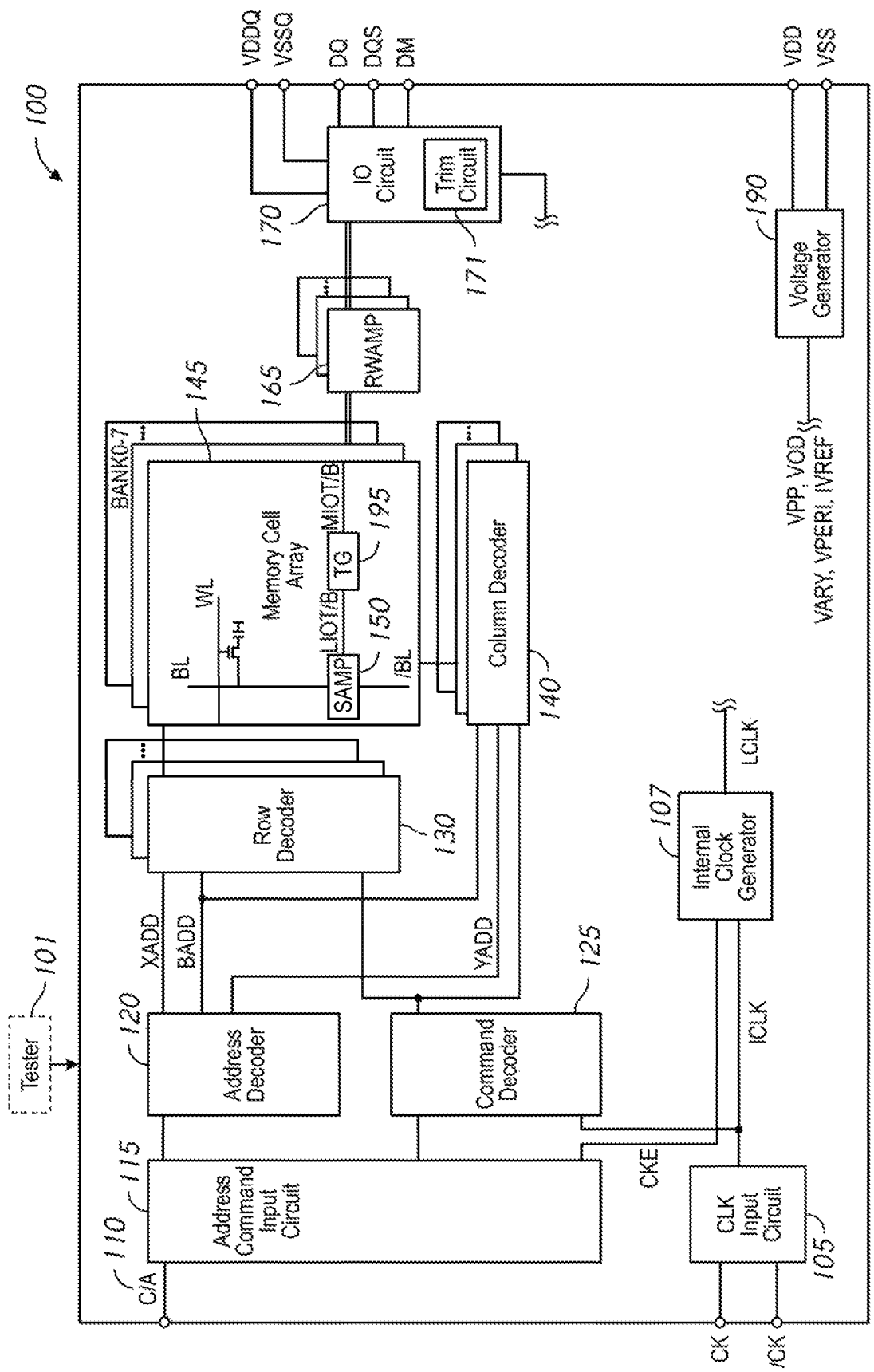
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a mother board or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the I/O circuit 170. The I/O circuit 170 may provide the read data DQ to outside via the data terminals DQ, DQS together with a data strobe signal at DQS. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

In some examples, the I/O circuit 170 may include input or output buffers (e.g., buffers) configured to condition the read and write data for transmission or reception via the DM, DQS, and DQ pads. The buffers may include additional circuitry to trim an input stage of a buffer to adjust a transition (e.g., trip) voltage to a target transition voltage. The transition voltage is an input voltage value that causes an output signal to transition from one logical value to another logical value, e.g., from a logical low value to a logical high value or from the logical low value to the logical high value). Because of differences created by process variation, transition voltages for individual buffers may vary from buffer to buffer, which may affect data eye alignment and set-up and hold times between the buffers. In high speed and low voltage applications, these variations may induce errors in data conditioning for downstream circuitry, which may affect reliability of the semiconductor device 100. Trimming an input stage of a buffer may adjust the transition voltage of the buffer to more closely align with the target transition voltage, in some examples. In some examples, the additional circuitry to adjust the input stage of the buffer may include pairs of serially-coupled transistors that are coupled to on another in parallel. The pairs of serially-coupled transistors may be selectively enabled to adjust a width of one or both sides of the input stage.

In some examples, the magnitude an adjustment may be based on a detected buffer mismatch, e.g., a voltage amount that a transition voltage is offset from the target transition voltage. In some examples, the target transition voltage may be based on a reference voltage VREF provided from the voltage generator 190. The VREF voltage may be between a ground or VSS voltage and a high or VDD voltage. In some examples, the VREF voltage may be half of the VDD voltage. The buffer mismatch may be determined via a mismatch detection operation. The mismatch detection operation may be initiated or controlled by a tester 101 coupled to the semiconductor device 100, in some examples. The tester 101 may be configured to communicate with the semiconductor device via the command and address bus 110, the DQs, or some other test connection (not shown). The mismatch detection operation may include connecting both inputs of the input stages the VREF voltage from the voltage generator 190, and iteratively performing write and read operations and adjusting pull-up and/or pull-down drive strength (e.g., via changing testmodes) of each input stage and a target row of memory cells for each write operation iteration. The write operations may include storing a state of the respective output signal of each respective buffer, which may be based on the current testmode, in a respective memory cell of the target row of memory cells. The testmodes may adjusted according to a predetermined step size. The testmode adjustments may including having a fixed pull-up drive strength and adjusting a pull-down drive strength, having a fixed pull-down drive strength and adjusting a pull-up drive strength, or combinations thereof. At some testmode setting, the state of the output signal of a buffer will transition from one logical value to an opposite logical value, which may be reflected in the memory cell corresponding to the write operation that stored that the output signal state. The testmode at which this transition occurs may indicate the transition voltage. Because each write operation is directed to a different memory cell and because each write operation corresponds to a particular test signal voltage, the states of the memory cells may be read to determine which testmode value corresponds to the transition voltage. Thus, to determine the transition voltage, the states of the memory cells corresponding to the write operations may be read to determine the write operation at which the state of the output signal transitioned to a different value. In some scenarios, the transition voltage for an increasing test signal voltage may be different than the transition voltage for a decreasing test signal voltage. The adjustment for a buffer having a different transition voltage for each transition direction may be based on one of the transition voltages or may be based on an average of the transition voltage offsets. In some examples, the mismatch detection operation may include first performing all of the write operations, with each write operation targeting a different row of memory cells, and subsequently performing the read operations to determine which write operation (e.g., and therefore reference voltage value) that a data state of a column of the memory cells changed from one logical value to a different logical value to determine the transition voltage of an individual buffer.

After determining the transition voltage, trim circuitry 171 associated with a buffer may be programmed to adjust an input stage of the buffer to adjust the transition voltage to the target transition voltage. The serially-coupled transistor pairs of the input stage may be selectively enabled via the programmed state of the trim circuitry 171. The trim circuitry 171 may include fuses or anti-fuses that are programmed according to the desired adjustment for each individual buffer. Adjusting a trim of each individual buffer may better align the transition voltages, which may align setup and hold timing of the buffers, collectively. This alignment may improve reliability of the buffers.

Turning to the explanation of the external terminals included in the semiconductor device 100, the clock terminals CK and/CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the I/O circuit 170. The I/O circuit 170 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, VREF, and the like based on the power supply voltages VDD and VSS. The internal voltage VPP are mainly used in the row decoder 130, the internal voltages VOD and VARY are mainly used in the sense amplifiers 150 included in the memory cell array 145, and the internal voltage VPERI is used in many other circuit blocks. The I/O circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the I/O circuit 170.

Figure 2:
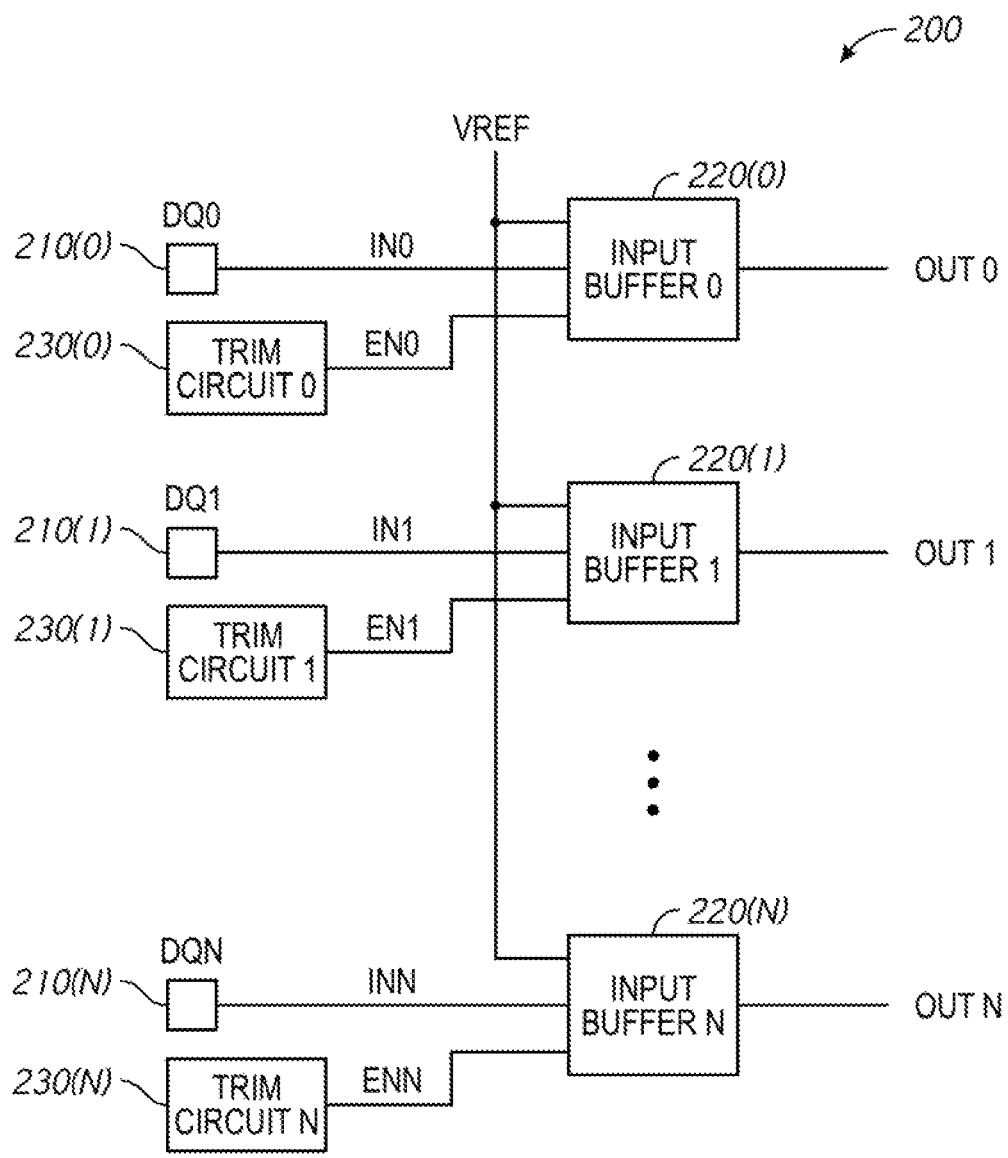
FIG. 2 is a schematic diagram of input buffers of an input/output (I/O) circuit in accordance with an embodiment of the disclosure.

FIG. 2 is a schematic diagram of input buffers of an input/output (I/O) circuit 200 in accordance with an embodiment of the disclosure. The I/O circuit 170 of FIG. 1 may implement the I/O circuit 200 of FIG. 2. The I/O circuit 200 may include the input buffers 220(0)-(N) each configured to receive a reference voltage VREF and a respective input signal IN0-INN via a respective data pad DQ0-DQN 210(0)-(N). Each of the input buffers 220(0)-(N) may include respective differential amplifier circuits. In some examples, the VREF voltage may be between a ground or VSS voltage and a high or VDD voltage. In some examples, the VREF voltage may be half of the VDD voltage. The input buffers 220(0)-(N) may each be further configured to receive respective enable signals EN0-ENN from respective trim circuits 230(0)-(N). The EN0-ENN signals may provide an adjustment or trim of the input buffers 220(0)-(N) to align transition voltages of the input buffers 220(0)-(N). Each of the trim circuits 230(0)-(N) may include fuses or anti-fuses that are programmed to control the respective EN0-ENN signals.

In operation, the input buffers 220(0)-(N) may be configured to condition read data encoded in the IN0-INN signals revived via the DQ pads 210(0)-210(N) to provide the respective OUT0-OUTN signals. The IN0-INN signal may include a high speed implementation, such as a double data rate implementation where data is detected at both rising and falling edges of a clock signal cycle, such as the DQS signal of FIG. 1. Because of high speed implementation, misalignment of setup and hold times across the input buffers 220(0)-(N) may introduce errors in detection of the output data provided to downstream circuitry via the OUT0-OUTN signals. The misalignment may be caused by process variation introduced during production and manufacturing of a semiconductor device that includes the input buffers 220(0)-(N). The misalignment may manifest itself as differences in transition voltages for individual input buffers 220(0)-(N). The transition voltage of an input buffer is a voltage value of the IN0-INN signal at which the OUT0-OUTN signal transitions from one logical value or voltage level to another logical value or voltage level, e.g., from a logical low value or voltage level (e.g., VSS) to a logical high value or voltage level (e.g., VDD) or from the logical low value to the logical high value.

The EN0-ENN signals from the trim circuits 230(0)-(N) may adjust the transition voltage of each individual input buffer 220(0)-220(N) based on a detected transition voltage offset from a target transition voltage. In some examples, the target transition voltage is the VREF voltage. The EN0_ENN signals may control a width of one or both sides of an input stage of the respective input buffer 220(0)-(N). In some examples, the input stage of each input buffer 220(0)-(N) may include multiple serially-coupled transistor pairs that are coupled together in parallel, where one transistor of each pair receives the VREF or the respective IN0-INN signal and the other receives a signal of the respective EN0-ENN signal. Thus, a transistor pair is enabled via the corresponding signal of the respective EN0-ENN signal.

The transition voltage offset may be determined via a mismatch detection operation, which may be initiated or controlled by a tester (e.g., the tester 101 of FIG. 1). The mismatch detection operation may include connecting the IN0-INN signals to the VREF voltage, and iteratively performing write and read operations and adjusting a drive strength of the input buffers 220(0)-(N) (e.g., change a testmode) and a target row of memory cells for each write operation iteration. The write operations may include storing a state of the respective OUT0-OUTN signals of the input buffers 220(0)-(N), which are based on the drive strength of each of the input buffers 220(0)-(N) set by the testmode, in a respective memory cell of the target row of memory cells. The drive strength may be adjusted according to a predetermined step. The drive strength may be incremented, in some examples, or may be may be decremented in other examples. At some respective test signal voltage, the state of each of the OUT0-OUTN signals will transition from one logical value to an opposite logical value, and this transition may be reflected in the data state of the respective memory cell in which the OUT0-OUTN signal state is stored. The testmode at which this transition occurs may indicate the respective transition voltage associated with each input buffer 220(0)-(N). To determine the transition voltage, the states of the memory cells corresponding to the write operations may be read to determine the first memory cell to have a different state than a previous memory cell of the memory cells corresponding to the write operations. In some scenarios, the transition voltage for a pull-up circuit may be different than the transition voltage for a pull-down circuit of each of the input buffers 220(0)-(N). The adjustment for a respective input buffer 220(0)-(N) having a different transition voltage for each transition direction may be based on one of the transition voltages or may be based on an average of the transition voltage offsets. In some examples, the mismatch detection operation may include first performing all of the write operations, with each write operation targeting a different row of memory cells, and subsequently performing the read operations to determine which write operation (e.g., and therefore reference voltage value) that a data state of a column of the memory cells changed from one logical value to a different logical value to determine the transition voltage of an individual buffer. The trim circuits 230(0)-(N) may be programmed to adjust the respective transition voltage to the target transition voltage based an amount the respective detected transition voltage is offset relative to the target transition voltage. Adjusting a transition voltage of each individual input buffer 220(0)-(N) may better align setup and hold timing of the input buffers 220(0)-(N), collectively, which may improve reliability of the input buffers 220(0)-(N).

Figure 3:
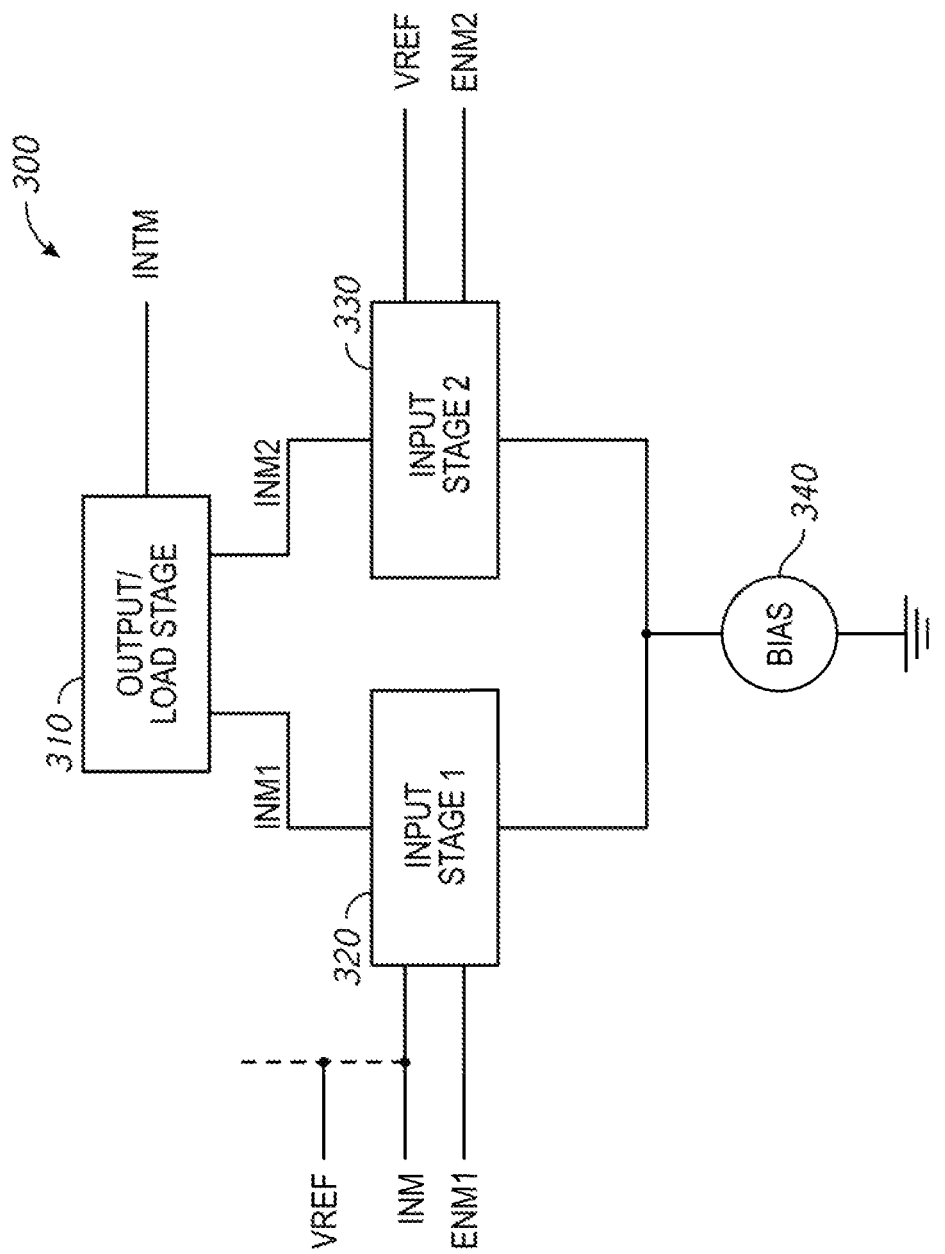
FIG. 3 is a schematic diagram of an input buffer in accordance with an embodiment of the disclosure.

FIG. 3 is a schematic diagram of an input buffer 300 in accordance with an embodiment of the disclosure. The I/O circuit 170 of FIG. 1 and/or any of the input buffers 220(0)-(N) of the I/O circuit 200 of FIG. 2 may implement the input buffer 300 of FIG. 3. The input buffer 300 may include a differential amplifier circuit. The input buffer 300 may include an output/load stage 310 coupled to a first input stage circuit 320 and a second input stage circuit 330. The first input stage circuit 320 and the second input stage circuit 330 may form an input stage. The first input stage circuit 320 may be configured to receive an input signal INM and enable signals ENM1 and to provide a first output stage input signal INM1. The second input stage circuit 330 may be configured to receive a reference voltage VREF and enable signals ENM2 and to provide a second output stage input signal INM2. The ENM1 and ENM2 signals may be provided from a trim circuit, such as the trim circuitry 171 of FIG. 1 and/or a respective one of the trim circuits 230(0)-(N) of FIG. 2. The ENM1 and ENM2 signals may provide an adjustment or trim of the respective first input stage circuit 320 or the second input stage circuit 330 to align a transition voltage of the input buffer 300 to a target transition voltage, such as the VREF voltage. In some examples, the VREF voltage may be between a ground or VSS voltage and a high or VDD voltage. In some examples, the VREF voltage may be half of the VDD voltage.

In operation, the input buffer 300 may be configured to receive data encoded in the INM signal and to provide the OUTM signal based on the data encoded in the INM signal. The first input stage circuit 320 may receive the INM signal and the ENM1 signals and may provide the INM1 signal to the output/load stage 310 in response to a value of the INM signal. The first input stage circuit 320 may receive the VREF voltage signal and the ENM2 signals and may provide the INM2 signal to the output/load stage 310 in response to a value of the VREF voltage. The magnitude of the INM1 signal, the INM2 signal, and the OUTM signal may be based on a voltage of the bias voltage component 340 and a VDD voltage. The bias voltage component 340 may provide an offset voltage above a ground voltage. The bias voltage component 340 may include a resistor, a transistor, or some other circuit to provide the bias voltage to the first input stage circuit 320 and the second input stage circuit 330. The output/load stage 310 may include circuitry to receive the INM1 and INM2 signals and to provide the OUTM signal in response to values of the INM1 and INM2 signals. The circuitry of the output/load stage 310 may include resistors coupled in parallel to a voltage source or a current mirror circuit. In some examples, a transition voltage of the input buffer 300 may be offset from the target transition voltage (e.g., the VREF voltage) due to process variation introduced during production and manufacturing of the input buffer 300. The transition voltage of the input buffer 300 is a voltage value of the INM signal at which the OUTM signal transitions from one logical value or voltage level to another logical value or voltage level, e.g., from a logical low value or voltage level (e.g., VSS) to a logical high value or voltage level (e.g., VDD) or from the logical low value to the logical high value). This transition voltage offset may cause errors in the OUTM signal relative to a value of the INM signal.

In some examples, the ENM1 signals may adjust the transition voltage by adjusting a width of the first input stage circuit 320 and the ENM2 signals may adjust the transition voltage by adjusting a width of the second input stage circuit 330. While the input buffer 300 of FIG. 3 is depicted with both of the first input stage circuit 320 and the second input stage circuit 330 being adjustable, the input buffer 300 may also be implemented with only one of the first input stage circuit 320 or the second input stage circuit 330 being adjustable. The transition voltage adjustment may be based on the detected transition voltage offset from the target transition voltage. In some examples, the first input stage circuit 320 and/or the second input stage circuit 330 may include multiple serially-coupled transistor pairs coupled in parallel to one another, wherein one transistor of each pair receives the VREF or the respective IN0-INN signal and the other receives a signal of the respective EN0-ENN signal. Thus, a transistor pair is enabled via the corresponding signal of the respective ENM1 signals or the ENM2 signals.

The transition voltage offset may be determined via a mismatch detection operation, which may include coupling the first input stage circuit 320 to the VREF voltage via the switch 304, and iteratively performing write and read operations and adjusting a width of the first input stage circuit 320 via the ENM1 signals and/or adjusting a width of the second input stage circuit 330 via the ENM2 signals and adjusting a target row of memory cells for each write operation iteration. The states of the memory cells may be read to determine the transition voltage In some scenarios, the transition voltage for a pull-up voltage transition may be different than the pull-down voltage transition. The adjustment for the input buffer 300 having a different transition voltage for each transition direction may be based on one of the transition voltages or may be based on an average of the transition voltage offsets. In some examples, the mismatch detection operation may include first performing all of the write operations, with each write operation targeting a different row of memory cells, and subsequently performing the read operations to determine which write operation (e.g., and therefore reference voltage value) that a data state of a column of the memory cells changed from one logical value to a different logical value to determine the transition voltage of an individual buffer. Adjusting a transition voltage of the input buffer 300 may better align setup and hold timing with other input buffers.

Figure 4:
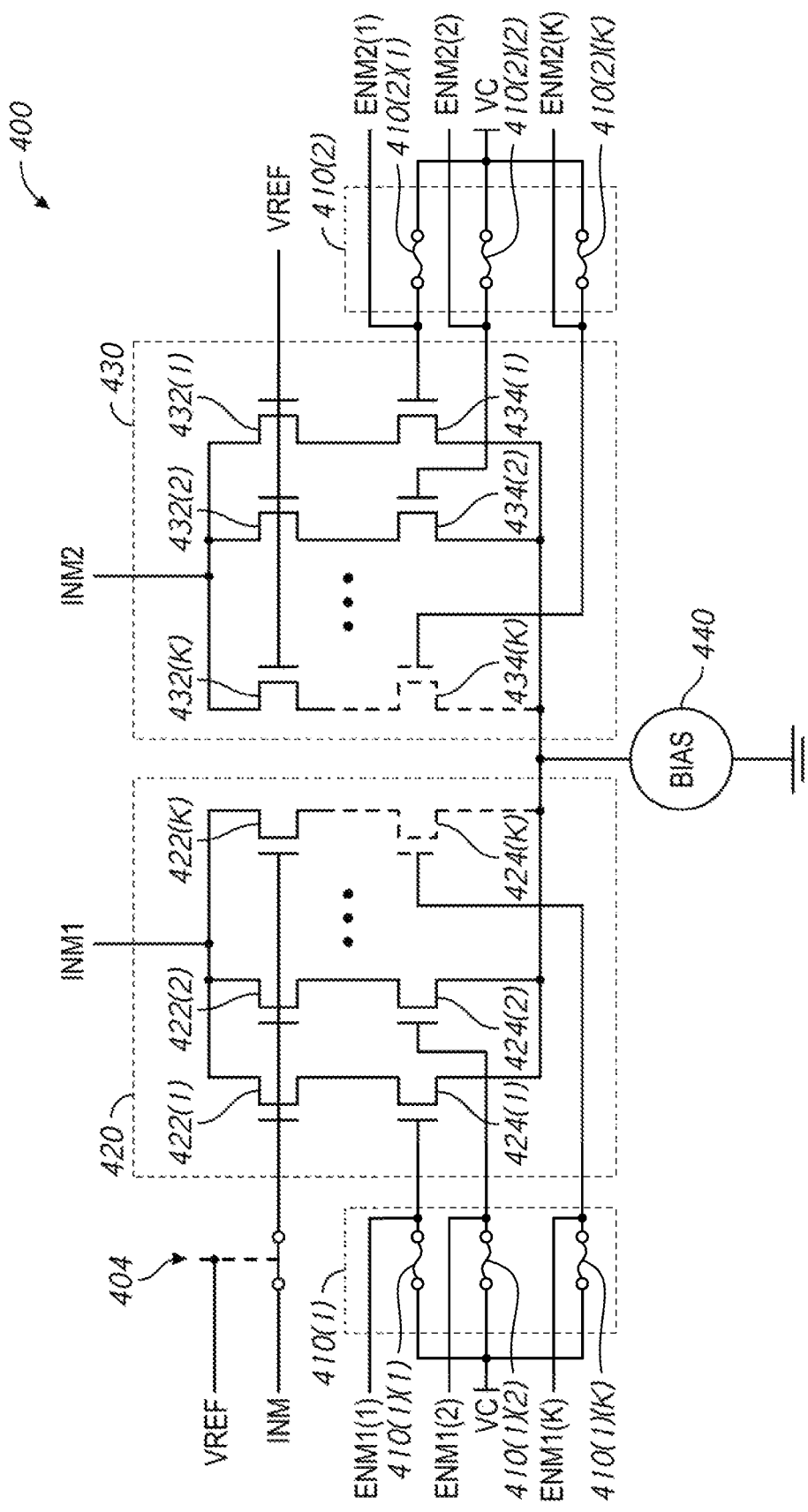
FIG. 4 is a schematic diagram of an input stage of a buffer in accordance with an embodiment of the disclosure.

FIG. 4 is a schematic diagram of an input stage 400 of a buffer in accordance with an embodiment of the disclosure. The I/O circuit 170 of FIG. 1, any of the input buffers 220(0)-(N) of the I/O circuit 200 of FIG. 2, and/or the first input stage circuit 320 and second input stage circuit 330 of FIG. 3 may implement the input stage 400 of FIG. 4. The input stage 400 may include a first input stage circuit 420 and a second input stage circuit 430. The first input stage circuit 420 may be configured to receive an input signal INM and enable signals ENM1(1)-(k) and to provide a first output stage input signal INM1. The second input stage circuit 330 may be configured to receive a reference voltage VREF and enable signals ENM2(1)-(k) and to provide a second output stage input signal INM2. The ENM1(1)-(k) and ENM2(1)-(k) signals may be provided from a trim circuit 410(1) and a trim circuit 410(2), respectively, such as the trim circuitry 171 of FIG. 1 and/or a respective one of the trim circuits 230(0)-(N) of FIG. 2. The ENM1(*l*)-(k) and ENM2(1)-(k) signals may cause an adjustment of the respective first input stage circuit 420 or the second input stage circuit 430 to align the transition voltage of the input stage 400 to a target transition voltage, such as the VREF voltage. In some examples, the VREF voltage may be between a ground or VSS voltage and a high or VDD voltage. In some examples, the VREF voltage may be half of the VDD voltage.

The first input stage circuit 420 may include serially-coupled transistor pairs from by transistors 422(1)-(k) and transistors 424(1)-(k). That is, a first pair of transistors includes transistor 422(1) coupled in series with transistor 424(1), a second pair of transistors includes transistor 422(2) coupled in series with transistor 424(2), etc. The transistors pairs are coupled in parallel. For example, the first transistor pair is coupled in series with the second transistor pair. Each of the transistors 422(1)-(k) are configured to receive the INM signal at a respective gate to control whether the respective transistor 422(1)-(k) is enabled or disabled. The trim circuit 410(1) includes programmable circuit components 410(1)(1)-(1)(k), such as fuses or anti-fuses, that are configured to couple a VC voltage to the gates of the transistors 424(1)-(k). The programmable circuit components 410(1)(1)-(1)(k) of the trim circuit 410(1) may be programmed based on a transition voltage offset from a target transition voltage detected during a mismatch offset operation. In some examples, programmable components are fuses and the VC voltage is a high voltage that enables the transistors 424(1)-(k) when the transistors are n-type transistors. In other examples, programmable components are anti-fuses and the VC voltage is a low voltage that enables the transistors 424(1)-(k) when the transistors are p-type transistors. Each of the transistors 424(1)-(k) are also configured to receive a respective one of the ENM1(1)-(k) signals at a respective gate to control whether the respective transistor 424(1)-(k) is enabled or disabled during a mismatch detection operation. When one of the respective transistors 424(1)-(k) is enabled via the respective programmable circuit component 410(1)(1)-(1)(k), the transistor 422(1)-(k) of the same corresponding pair is configured to couple the bias voltage 440 to the INM1 signal based on a value of the INM signal. Enabling more of the transistors 424(1)-(k) may reduce the impedance of the first input stage circuit 420, which may adjust a transition voltage lower. Alternatively, disabling more of the transistors 424(1)-(k) may increase the impedance of the first input stage circuit 420, which may adjust a transition voltage higher. In some examples, the transistor 424(k) may be excluded and the transistor 422(k) may be coupled directly to the bias voltage 440 without departing from the scope of the disclosure.

The second input stage circuit 430 may include serially-coupled transistor pairs from by transistors 432(1)-(k) and transistors 434(1)-(k). That is, a first pair of transistors includes transistor 432(1) coupled in series with transistor 434(1), a second pair of transistors includes transistor 432(2) coupled in series with transistor 434(2), etc. The transistors pairs are coupled in parallel. For example, the first transistor pair is coupled in series with the second transistor pair. Each of the transistors 432(1)-(k) are configured to receive the VREF voltage at a respective gate to control whether the respective transistor 432(1)-(k) is enabled or disabled. The trim circuit 410(2) includes programmable circuit components 410(2)(1)-(2)(k), such as fuses or anti-fuses, that are configured to couple a VC voltage to the gates of the transistors 434(1)-(k). The programmable circuit components 410(2)(1)-(2)(k) of the trim circuit 410(2) may be programmed based on a transition voltage offset from a target transition voltage detected during a mismatch offset operation. In some examples, programmable circuit components 410(2)(1)-(2)(k) are fuses and the VC voltage is a high voltage that enables the transistors 434(1)-(k) when the transistors are n-type transistors. In other examples, programmable circuit components 410(2)(1)-(2)(k) are anti-fuses and the VC voltage is a low voltage that enables the transistors 434(1)-(k) when the transistors are p-type transistors. Each of the transistors 434(1)-(k) are also configured to receive a respective one of the ENM2(1)-(k) signals at a respective gate to control whether the respective transistor 434(1)-(k) is enabled or disabled during a mismatch detection operation. When one of the respective transistors 434(1)-(k) is enabled via the respective programmable circuit component 410(2)(1)-(2)(k), the transistor 432(1)-(k) of the same corresponding pair is configured to couple the bias voltage 440 to the INM2 signal based on a value of the VREF voltage. Enabling more of the transistors 434(1)-(k) may reduce the impedance of the second input stage circuit 430, which may adjust a transition voltage higher. Alternatively, disabling more of the transistors 434(1)-(k) may increase the impedance of the second input stage circuit 430, which may adjust a transition voltage lower. In some examples, the transistor 434(k) may be excluded and the transistor 432(k) may be coupled directly to the bias voltage 440 without departing from the scope of the disclosure.

The mismatch detection operation may include enabling all of the transistors 424(1)-(k) and 434(1)-(k) and coupling the transistors 422(1)-(k) to the VREF voltage via the switch 404, and iteratively performing write and read operations and adjusting a testmode (e.g., adjusting a width of the first input stage circuit 420 via the ENM1(1)-(k) signals and/or adjusting a width of the second input stage circuit 430 via the ENM2(1)-(k) signals) and adjusting a target row of memory cells for each write operation iteration and reading the memory cell states to determine testmode value corresponds to the transition voltage. The testmode that results in the transition voltage may be used to program the programmable circuit components 410(1)(1)-(1)(k) of the trim circuit 410(1) and or the programmable circuit components 410(2)(1)-(2)(k) of the trim circuit 410(2).

While FIG. 4 depicts the first input stage circuit 420 and the second input stage circuit 430 as both being configurable via the transistors 424(1)-(k), the transistors 434(1)-(k), and the trim circuits 410(1)-(2), the input stage 400 may be implemented such that only one of the first input stage circuit 420 or the second input stage circuit 430 is configurable to adjust the transition voltage of the input stage 400, without departing from the scope of the disclosure. For example, the first input stage circuit 420 may include one or more of the transistors 422(1)-(k) coupled directly to the bias voltage 440 and the trim circuit 410(1) may be excluded such that only the second input stage circuit 430 is configurable to adjust the transition voltage of the input stage 400. Alternatively, the second input stage circuit 430 may include one or more of the transistors 432(1)-(k) coupled directly to the bias voltage 440 and the trim circuit 410(2) may be excluded such that only the first input stage circuit 420 is configurable to adjust the transition voltage of the input stage 400.

Figure 5B:
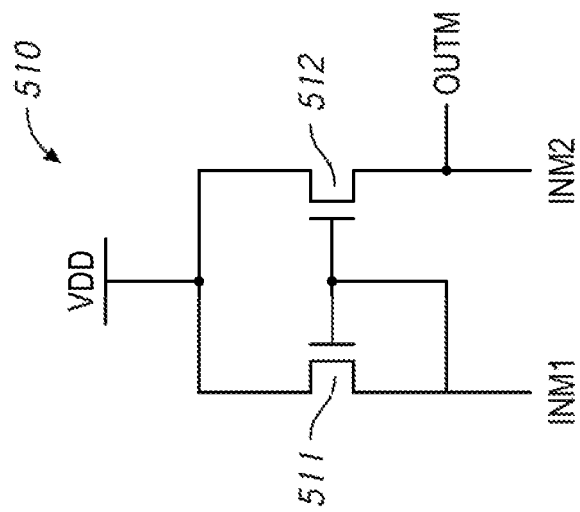
FIGS. 5A and 5B are a schematic diagrams of an output stages of a buffer in accordance with an embodiment of the disclosure.
Figure 5A:
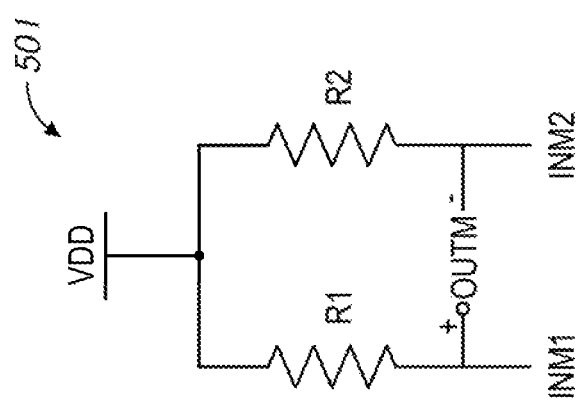

FIGS. 5A and 5B are a schematic diagrams of an output stage 500 and an output stage 510, respectively, of a buffer in accordance with an embodiment of the disclosure. The I/O circuit 170 of FIG. 1, any of the input buffers 220(0)-(N) of the I/O circuit 200 of FIG. 2, and/or the output/load stage 310 of FIG. 3 may implement the output stage 500 or the output stage 510 of FIGS. 5A and 5B, respectively.

The output stage 500 may include resistor R1 coupled between the VDD voltage and a node from a first input stage circuit (e.g., the first input stage circuit 320 of FIG. 3 or the first input stage circuit 420 of FIG. 4) configured to provide the INM1 signal. The output stage 500 may further include resistor R2 coupled between the VDD voltage and a node from a second input stage circuit (e.g., the second input stage circuit 330 of FIG. 3 or the first input stage circuit 420 of FIG. 4) configured to provide the INM2 signal. The OUTM signal may be based on a voltage difference between a node receiving the INM1 signal and a node receiving the INM2 signal.

The output stage 510 may include transistor 511 coupled between the VDD voltage and a node from a first input stage circuit (e.g., the first input stage circuit 320 of FIG. 3 or the first input stage circuit 420 of FIG. 4) configured to provide the INM1 signal. The output stage 510 may further include a transistor 512 coupled between the VDD) voltage and a node from a second input stage circuit (e.g., the second input stage circuit 330 of FIG. 3 or the first input stage circuit 420 of FIG. 4) configured to provide the INM2 signal. The gates of the transistors 511 and 512 may be coupled together and to a node receiving the INM1 signal to form a current mirror circuit such that the current through the transistor 512 mirrors the current through the transistor 511. The OUTM signal may be based on a voltage of a node receiving the INM2 signal.

Figure 6:
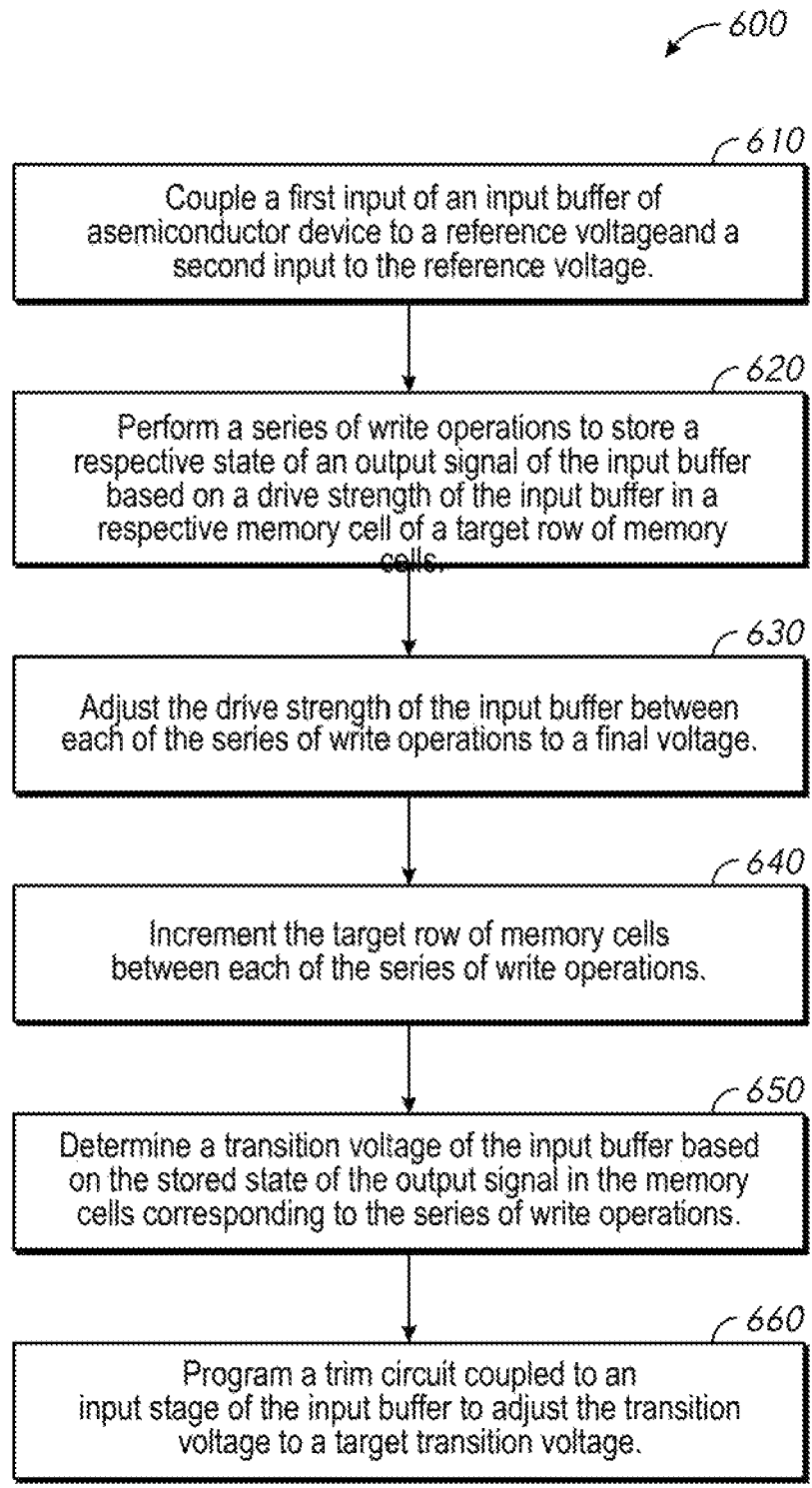
FIG. 6 is a flow diagram of a method for a mismatch detection operation of a buffer in accordance with embodiments of the disclosure.

FIG. 6 is a flow diagram of a method 600 for a mismatch detection operation of a buffer in accordance with embodiments of the disclosure. The method 600, all or in part, may be performed by the tester 104 and/or the semiconductor device 100, the I/O circuit 200 of FIG. 2, the input buffer 300 of FIG. 3, the input stage 400 of FIG. 4, and/or the output stage 500 or the output stage 510 of FIG. 5A or 5B, or any combination thereof.

The Method

The method 600 may include coupling a first input of an input buffer of a semiconductor device to a reference voltage and a second input of the input buffer to the reference voltage, at 610. The input buffer may include any of the input buffers 220(0)-(N) of FIG. 2, the input buffer 300 of FIG. 3, the input stage 400 of the buffer of FIG. 4, or combinations thereof. The first input may be coupled to the reference voltage via a switch, such as one of the switch 304 of FIG. 3 or the switch 404 of FIG. 4. The reference voltage may correspond to the VREF voltage of FIGS. 1-4.

The method 600 may further include performing a series of write operations to store a respective state of an output signal of the input buffer based on a drive strength of the input buffer in a respective memory cell of a target row of memory cells, at 620. The memory cells may include memory cells of the memory cell array 145 of FIG. 1.

The method 600 may further include adjusting the drive strength of the input buffer between each of the series of write operations, at 630. In some examples, adjusting the drive strength of the input buffer may include adjusting the drive strength of only one side of the input buffer between each of the series of write operations. In examples, the drive strength may start low and increase with each iteration. In other examples, the drive strength may start high and decrease with each iteration. The method 600 may further include incrementing the target row of memory cells between each of the series of write operations, at 640. In some examples, the test signal may be equal to the reference voltage and the reference voltages may be adjusted between each of the series of write operations to the final voltage.

The method 600 may further include determining a transition voltage of the input buffer based on the stored state of the output signal in the memory cells corresponding to the series of write operations, at 650. In some examples, the method may further include reading the stored state of the output signal from the memory cells corresponding to the series of write operations, and determining a first memory cell of the memory cells having a different stored state than a previous memory cell. The transition voltage may be determined based on the drive strength for the write operation of the series of write operations associated with the first memory cell.

The method 600 may further include programming a trim circuit coupled to an input stage of the input buffer to adjust the transition voltage to a target transition voltage, at 660. The trim circuit may include any of the trim circuits 230(0)-(N) of FIG. 2 or any of the trim circuits 410(1) or 410(2) of FIG. 4. The input stage may include the first input stage circuit 320 and the second input stage circuit 330 of FIG. 3 and/or the input stage 400 of FIG. 4. In some examples, programming the trim circuit coupled to an input stage of the input buffer may include selectively programming one or more programmable circuit components of the trim circuit to adjust the transition voltage to the target transition voltage.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosed disclosure. Thus, it is intended that the scope of at least some of the present disclosure herein disclosed should not be limited by the particular disclosed embodiments described above.

What is claimed is:

1. An apparatus comprising:
an input buffer having a first input stage circuit configured to receive a first signal, a second input stage circuit configured to receive a second signal, and an output stage coupled to the first and second input stage circuits and configured to provide an output signal, wherein the first input stage circuit comprises a plurality of serially-coupled transistor pairs that are each coupled between the output stage and a bias voltage, wherein each of the plurality of serially-coupled transistors pairs are selectively enabled in response to a respective enable signal; and
a trim circuit coupled to the first input stage circuit and comprising a plurality of programmable components; wherein the trim circuit is configured to be programmed to provide the respective enable signals based on a detected transition voltage offset relative to a target transition voltage.

2. The apparatus of claim 1, wherein a first transistor of a first pair of the plurality of serially-coupled transistor pairs is configured to receive the input signal and a second transistor of the first pair of the plurality of serially-coupled transistor pairs is configured to receive a first enable signal, wherein a first programmable component of the plurality of programmable components of the trim circuit is configured to provide the first enable signal.

3. The apparatus of claim 2, wherein the first programmable component is configured to provide a control voltage on to the first enable signal when programmed, wherein the second transistor is enabled via the first enable signal having the control voltage.

4. The apparatus of claim 3, wherein the first programmable component is a fuse and the second transistor is an n-type transistor or wherein the first programmable component is an anti-fuse and the second transistor is a p-type transistor.

5. The apparatus of claim 3, wherein the trim circuit is further configured to be coupled to other enable signals during a mismatch detection operation.

6. The apparatus of claim 5, wherein the other enable signals are selectively controlled via a testmode from a tester.

7. The apparatus of claim 1, wherein the first input stage circuit comprises an additional transistor coupled between the output stage and the bias voltage and is configured to receive the input signal.

8. The apparatus of claim 1, wherein the second input stage circuit comprises a second plurality of serially-coupled transistor pairs that are each coupled between the output stage and a bias voltage, wherein each of the second plurality of serially-coupled transistors pairs are selectively enabled in response to a respective enable signal, the apparatus further comprising:
    a second trim circuit coupled to the second input stage circuit and comprising a second plurality of programmable components; wherein the second trim circuit is configured to be programmed to provide the respective enable signals to the second input stage circuit based on a detected transition voltage offset relative to a target transition voltage.

9. The apparatus of claim 1, wherein the first input stage circuit, the second input stage circuit, and the output stage form a differential amplifier.

10. The apparatus of claim 1, wherein the output stage includes load circuitry.

11. The apparatus of claim 9, wherein the load circuitry includes at least one of a current mirror or resistors or diodes.

12. An apparatus including:
    a plurality of input buffers coupled to respective data pads to receive input signals and are each configured to receive a reference voltage and to provide an output voltage based on the reference voltage and the respective input signal; wherein each of the plurality of input buffers comprise a respective input stage that is configured to be adjusted to align respective transition voltages to a target transition voltage in response to respective enable signals; and
    a plurality of trim circuits each coupled to a respective one of the plurality of input buffers, wherein each of the plurality of trim circuits comprises a respective plurality of programmable components that are configured to be programmed to provide the respective enable signals based on a respective detected transition voltage offset of the coupled input buffer relative to the target transition voltage.

13. The apparatus of claim 12, wherein the respective input stage of each of the plurality of input buffers comprises a first input stage circuit and a second input stage circuit, wherein the first input stage circuit is configured to be adjusted to align the respective transition voltages to the target transition voltage in response to the respective enable signals, wherein each of the plurality of trim circuits further comprises a respective second plurality of programmable components that are configured to be programmed to provide the respective second enable signals based on the respective detected transition voltage offset of the coupled input buffer relative to the target transition voltage.

14. The apparatus of claim 13, wherein the second input stage circuit is configured to be adjusted to align the respective transition voltages to the target transition voltage in response to respective second enable signals, wherein each of the plurality of trim circuits further comprises a respective second plurality of programmable components that are configured to be programmed to provide the respective second enable signals based on the respective detected transition voltage offset of the coupled input buffer relative to the target transition voltage.

15. The apparatus of claim 13, wherein the first input stage circuit comprises a plurality of serially-coupled transistor pairs that are each coupled between the output stage and a bias voltage and are enabled via the respective enable signals.

16. The apparatus of claim 13, wherein the plurality of serially-coupled transistor pairs comprise n-type or p-type transistors.

17. A method comprising:
    coupling a first input of an input buffer of a semiconductor device to a reference voltage and a second input of the input buffer to the reference voltage;
    performing a series of write operations to store a respective state of an output signal of the input buffer based on a drive strength of the input buffer in a respective memory cell of a target row of memory cells;
    adjusting the drive strength of the input buffer between each of the series of write operations;
    incrementing the target row of memory cells between each of the series of write operations;
    determining a transition voltage of the input buffer based on the stored state of the output signal in the memory cells corresponding to the series of write operations; and
    programming a trim circuit coupled to an input stage of the input buffer to adjust the transition voltage to a target transition voltage.

18. The method of claim 17, further comprising:
    reading the stored state of the output signal from the memory cells corresponding to the series of write operations; and
    determining a first memory cell of the memory cells having a different stored state than a previous memory cell; wherein the transition voltage is determined based on the test signal voltage for the write operation of the series of write operations associated with the first memory cell.

19. The method of claim 17, wherein programming the trim circuit coupled to an input stage of the input buffer comprises selectively programming one or more programmable components of the trim circuit to adjust the transition voltage to the target transition voltage.

20. The method of claim 17, wherein adjusting the drive strength of the input buffer includes adjusting the drive strength of only one side of the input buffer between each of the series of write operations.

* * * * *